United States Patent
Woo et al.

(10) Patent No.: US 11,545,645 B2
(45) Date of Patent: Jan. 3, 2023

(54) METHOD FOR PREPARING ORGANIC ELECTRONIC DEVICE

(71) Applicant: LG CHEM, LTD., Seoul (KR)

(72) Inventors: Yu Jin Woo, Daejeon (KR); Joon Hyung Kim, Daejeon (KR); Kook Hyun Choi, Daejeon (KR); Mi Lim Yu, Daejeon (KR)

(73) Assignee: LG Chem, Ltd., Seoul (KR)

( * ) Notice: Subject to any disclaimer, the term of this patent is extended or adjusted under 35 U.S.C. 154(b) by 324 days.

(21) Appl. No.: 16/643,419

(22) PCT Filed: Aug. 31, 2018

(86) PCT No.: PCT/KR2018/010119
§ 371 (c)(1),
(2) Date: Feb. 28, 2020

(87) PCT Pub. No.: WO2019/045508
PCT Pub. Date: Mar. 7, 2019

(65) Prior Publication Data
US 2021/0028394 A1    Jan. 28, 2021

(30) Foreign Application Priority Data

Sep. 1, 2017    (KR) .................... 10-2017-0111730

(51) Int. Cl.
*H01L 51/52*        (2006.01)
*H01L 51/56*        (2006.01)
(52) U.S. Cl.
CPC .......... *H01L 51/5253* (2013.01); *H01L 51/56* (2013.01)

(58) Field of Classification Search
None
See application file for complete search history.

(56) References Cited

U.S. PATENT DOCUMENTS 8,445,898 B2    5/2013   Kim et al.
8,828,763 B1 *  9/2014   Lee ..................... H01L 51/0026
                                                         438/34

(Continued)

FOREIGN PATENT DOCUMENTS

CN    103764301 A    4/2014
CN    103959501 A    7/2014

(Continued)

OTHER PUBLICATIONS

M. Kay, "Select the most effective wavelength for an LED system", Nov. 29, 2010, XP055923910.

*Primary Examiner* — Michelle Mandala
(74) *Attorney, Agent, or Firm* — Dentons US LLP

(57) ABSTRACT

Provided is a method for preparing an organic electronic device, comprising steps of: applying an ink composition on a substrate, on which an organic electronic element is formed; applying heat thereto before curing the applied ink composition; and curing the applied ink composition by irradiating with light having a wavelength in a range of 300 nm to 450 nm. Also provided is an organic electronic device, comprising a substrate, an organic electronic element formed on the substrate, and an organic layer sealing the entire surface of the organic electronic element, wherein after the organic layer is maintained at 110° C. for 30 minutes, the out-gas amount measured using Purge & Trap-gas chromatography/mass spectrometry is less than 150 ppm.

9 Claims, 1 Drawing Sheet

(56) References Cited

U.S. PATENT DOCUMENTS

| | | |
|---|---|---|
| 10,084,153 B2 | 9/2018 | Mihara et al. |
| 10,351,736 B2 | 7/2019 | Kim et al. |
| 10,414,926 B2 | 9/2019 | Park et al. |
| 2009/0215279 A1 | 8/2009 | Kim et al. |
| 2011/0260147 A1 | 10/2011 | Kim et al. |
| 2014/0362151 A1 | 12/2014 | Ito et al. |
| 2015/0318482 A1 | 11/2015 | Kwon et al. |
| 2015/0357570 A1 | 12/2015 | Lee et al. |
| 2016/0072098 A1 | 3/2016 | Lee et al. |
| 2016/0108263 A1 | 4/2016 | Yoo et al. |
| 2017/0062762 A1 | 3/2017 | Jain et al. |

FOREIGN PATENT DOCUMENTS

| | | |
|---|---|---|
| CN | 107079560 A | 8/2017 |
| JP | 2004-290722 | 10/2004 |
| JP | 2012014932 A | 1/2012 |
| JP | 2014-225380 A | 12/2014 |
| JP | 2015-025877 | 2/2015 |
| JP | 2015062166 A | 4/2015 |
| JP | 2015125955 | 7/2015 |
| JP | S59-14778 | 5/2016 |
| JP | 2017-060907 | 3/2017 |
| JP | 2017-176988 | 10/2017 |
| KR | 10-2006-0074716 | 7/2006 |
| KR | 10-0926030 | 11/2009 |
| KR | 10-2016-0011228 A | 1/2016 |
| KR | 10-2016-0046723 | 4/2016 |
| KR | 10-20160037126 | 4/2016 |
| KR | 10-1641480 | 7/2016 |
| KR | 10-20160114539 | 10/2016 |
| WO | 2013172359 A1 | 11/2013 |
| WO | 2017-086144 | 5/2017 |

\* cited by examiner

[Figure 1]
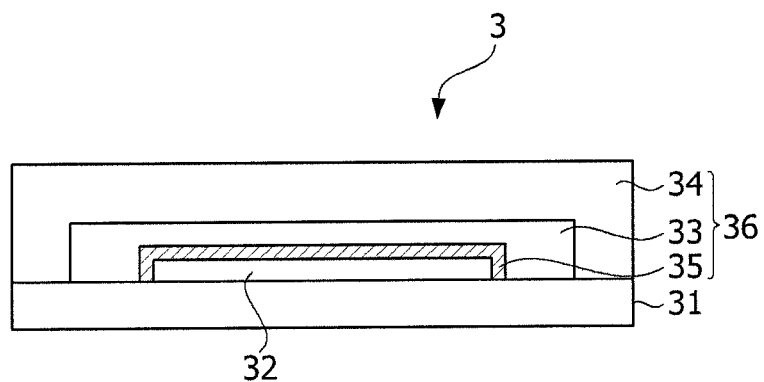
[Figure 2]
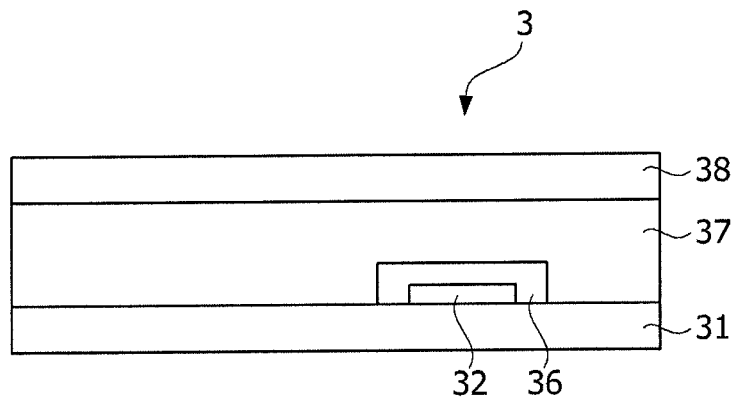

METHOD FOR PREPARING ORGANIC ELECTRONIC DEVICE

CROSS-REFERENCE TO RELATED APPLICATIONS

This application is a National Stage Application of International Application No. PCT/KR2018/010119 filed on Aug. 31, 2018, which claims the benefit of priority to Korean Patent Application No. 10-2017-0111730 filed on Sep. 1, 2017, the disclosures of which are incorporated herein by reference in their entirety.

TECHNICAL FIELD

The present application relates to a method for preparing an organic electronic device and an organic electronic device.

BACKGROUND

An organic electronic device (OED) means a device comprising a layer of an organic material that generates an alternating current of electric charges using holes and electrons, and an example thereof can include a photovoltaic device, a rectifier, a transmitter and an organic light emitting diode (OLED), and the like.

The organic light emitting diode (OLED) among the organic electronic devices has lower power consumption and faster response speed, than conventional light sources, and is advantageous for thinning display devices or illuminations. In addition, the OLED has excellent space utilization, so that it is expected to be applied in various fields covering various portable devices, monitors, notebooks, and televisions.

In commercialization and application expansion of OLEDs, the most important problem is a durability problem. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

DISCLOSURE

Technical Problem

The present invention relates to a method for preparing an organic electronic device, which provides a method for preparing an organic electronic device that can effectively block moisture or oxygen introduced from the outside into an organic electronic device, is excellent in flatness of a sealing film and can minimize an out-gas amount occurring in a sealing process, and an organic electronic device.

Technical Solution

The present application relates to a method for preparing an organic electronic device. The preparation method comprises forming a sealing film on an organic electronic element. The sealing film can be an organic layer, which can be encapsulated so as to cover the entire surface of the organic electronic element.

An exemplary preparation method can comprise steps of applying an ink composition on a substrate on which an organic electronic element is formed, applying heat thereto before curing the applied ink composition, and irradiating the applied ink composition with light having a wavelength in a range of 300 nm to 450 nm to cure it. The method of applying heat is not particularly limited, where the heating step can be performed using a hot plate or an oven. The present application comprises a step of heating the applied ink composition before curing it for encapsulation of an organic electronic element, whereby it can minimize the out-gas generated from the ink composition while improving the flatness of the sealing film formed on the organic electronic device. By minimizing the out-gas, the present application can prevent the physical and chemical damage of the organic electronic element resulting from the ink composition applied directly on the element.

In an embodiment of the present application, the curing can comprise irradiating it with light having any one wavelength of 300 nm to 450 nm, 320 nm to 425 nm, 355 nm to 400 nm or 380 nm to 398 nm with a light quantity of 0.3 to 6 $J/cm^2$ or a light quantity of 0.5 to 5 $J/cm^2$. In curing the ink composition applied on the organic electronic element, as the curing proceeds under the above conditions, the present application can prevent the element from being damaged by light while realizing a desired level of cure degree. On the other hand, in the preparation method, the step of applying heat can be distinguished from the step of curing. That is, the present application is to cure an ink composition by irradiating it with light, which can be subjected to a step of applying heat before the curing.

In one example, the preparation method can further include a step of applying heat after curing. That is, the step of applying heat can proceed before curing of the ink composition, or can proceed before and after curing. The step of applying heat can be performed in a range of 20° C. to 230° C., 23° C. to 200° C. or 24° C. to 164° C. Furthermore, the step of applying heat can proceed for any one time of 1 minute to 40 minutes or 2 minutes to 33 minutes. By adjusting the temperature or the time, the present application can reduce the out-gas amount while realizing excellent flatness when the ink composition applied on the element forms a sealing film, and can prevent the element from being damaged by the heating step.

In an embodiment of the present application, the step of applying heat can proceed once only before curing of the ink composition, or can proceed twice or more before and after curing. In the former case, the step of applying heat can proceed in a range of 80° C. to 150° C., 88° C. to 142° C., 92° C. to 137° C. or 96° C. to 123° C. for any one time of 1 minute to 40 minutes or 2 minutes to 35 minutes. In the latter case, the step of applying heat before curing can proceed in a range of 20° C. to 110° C., 22° C. to 98° C., 23° C. to 68° C., 24° C. to 58° C. or 28° C. to 37° C. for any one time of 1 minute to 40 minutes, 2 minutes to 35 minutes or 6 minutes to 15 minutes. In one example, if the heating temperature before curing is somewhat high, partial curing of the ink composition proceeds or side reactions occur, whereby it can be difficult to form a sealing film of desired physical properties. After the above step, the curing of the ink composition can proceed, where after the curing step, it can proceed in a range of 50° C. to 230° C., 55° C. to 180° C., 58° C. to 178° C., 60° C. to 172° C., 62° C. to 167° C. or 75° C. to 156° C. for any one time of 1 minute to 40 minutes, 2 minutes to 35 minutes or 2 minutes to 20 minutes. In one example, the ratio (T2/T1) of the temperature (T2) for applying heat after curing to the temperature (T1) for applying heat before curing can be 1.15 to 8, 1.3 to 7.8, 1.8 to 7.2, 2.1 to 6.8, 2.8 to 6.3 or 3.6 to 5.8. By controlling the heating temperature and/or time according to the timing of applying heat as above, the present application can reduce the out-gas amount while realizing excellent flatness when the ink composition applied on the element forms a sealing film, prevent the element from being damaged by the heating step and prevent some curing or side reactions of the applied composition.

In an embodiment of the present application, the preparation method can further comprise a step of planarizing the applied ink composition. The planarizing step can proceed before curing after the ink composition is applied, and can proceed simultaneously with the above-described heating step, or separately before or after the heating step. The planarizing step can proceed for any one time of 1 minute to 5 minutes. The planarizing step can be included so that the applied ink composition forms an organic film flat.

In the present application, the preparation method can comprise forming a reflective electrode or a transparent electrode on a substrate such as, for example, a glass or polymer film as a substrate by a method such as vacuum evaporation or sputtering and forming an organic material layer on the reflective electrode to form an organic electronic element. The organic material layer can comprise a hole injecting layer, a hole transporting layer, a light emitting layer, an electron injecting layer and/or an electron transporting layer. Subsequently, a second electrode is further formed on the organic material layer. The second electrode can be a transparent electrode or a reflective electrode.

The preparation method of the present application can further comprise a step of forming an inorganic layer on the first electrode, the organic material layer and the second electrode formed on the substrate. Thereafter, a sealing film (organic layer) is formed by applying an ink composition on the substrate so as to cover the entire surface of the organic electronic element. At this time, the step of forming an organic layer is not particularly limited, and the ink composition can be applied to the entire surface of the substrate using a process of inkjet printing gravure coating, spin coating, screen printing or reverse offset coating, and the like.

In an embodiment of the present application, the step of applying an ink composition can comprise ejecting an ink composition using an inkjet apparatus. As described above, the inkjet process can be applied to sealing or encapsulating organic electronic devices such as, for example, OLEDs.

In this specification, the term "organic electronic device" means an article or device having a structure comprising an organic material layer that generates an alternating current of electric charges using holes and electrons between a pair of electrodes facing each other, and an example thereof can include a photovoltaic device, a rectifier, a transmitter and an organic light emitting diode (OLED), and the like, but is not limited thereto. In one example of the present application, the organic electronic device can be an OLED.

In an embodiment of the present application, the ink composition can be a solventless type. Furthermore, the ink composition can be a photocurable composition. By using the ink composition, the present application minimizes the content of volatile organic compounds or ionic substances contained by using an organic solvent to minimize the out-gas amount in the sealing process, whereby the reliability of the organic electronic device can be ensured.

In an embodiment of the present application, after the applied ink composition is maintained at 110° C. for 30 minutes after curing, the out-gas amount measured using Purge & Trap-gas chromatography/mass spectrometry can be less than 150 ppm, less than 100 ppm or less than 50 ppm.

More specifically, after the ink composition is cured and the cured product is maintained at 110° C. for 30 minutes, the out-gas can be measured by using a Purge & Trap sampler (JAI JTD-505III)-GC/MS (Agilent 7890b/5977a) instrument with Purge & Trap-gas chromatography/mass spectrometry for cured samples. The sample to be measured can be an ink composition applied on a substrate, where it can be measured, for example, on a 50 mg sample. The lower limit thereof is not particularly limited, which can be 0 ppm or 10 ppm.

In this specification, the term "out-gas" can be generically referred to as materials which are present in an uncured state even after curing, such as volatile organic compounds or ionic materials present in the ink composition. The volatile organic compound can be defined as all organic compounds present in the gas phase in the atmosphere. It is used to collectively mean all organic substances that can exist in a gas state at room temperature and normal pressure, such as hydrocarbons composed of only carbon and hydrogen, halogenated hydrocarbons and nitrogen or sulfur-containing hydrocarbons, and in a broad sense, it can also include semi-volatile organic compounds. For example, in this specification, the volatile organic compounds can be organic solvents, thermal decomposition by-products of curing agents, or by-products generated by addition reaction. Furthermore, the ionic substance is not particularly limited as long as it is a substance which can cause wiring corrosion of the organic electronic device, and for example, it can be a halogen ion and can be a chlorine ion. The halogen ion as the ionic material can cause electrochemical corrosion of the organic electronic device, so that the damage to the organic electronic device can be prevented by controlling the content to a minimum.

In this specification, the term "Purge and Trap (P&T)" can mean a VOC (volatile organic compounds) pre-treatment instrument or method in which trace amounts of volatile organic compounds present in a sample are extracted and concentrated to transfer to gas chromatography (GC) or gas chromatography/mass spectrometry (GC/MS). In the use process, a sample containing volatile organic compounds is put into a small container in which air is blocked, and the volatile organic compound materials in the sample are purged and transported to the trap using a carrier gas. In the trap, volatile organic compounds are trapped and then these substances are passed through gas chromatography by again applying heat thereto.

In this specification, the gas chromatography/mass spectrometry (GC/MS) means a separation apparatus or a method thereof for distinguishing contents of a solution in various samples. The GC/MS is coupled by gas chromatography (GC) used to separate various compounds and a mass spectrometer (MS) for measuring atomic mass of a substance coming from the GC. The shape of retention time and mass for each compound are different. The GC/MS is connected to a computer in which specific type libraries of compounds are stored and thus does not only identify concentrations, but also types of substances as compared with the libraries identifying compounds in a solution. Continuous investigations after identifying the presence of the compound generally analyze the specific substance using the GC.

In the present application, the material of the ink composition applied to the above preparation method can be a solventless type photo-curable composition. The above-described preparation method of the present application can provide an organic electronic device having high reliability by being particularly applied to an ink composition of a specific composition to be described below.

An exemplary ink composition can comprise an epoxy compound and a compound having an oxetane group. The epoxy compound can be a photo-curable or thermosetting compound. The compound having an oxetane group can be included in a range of 45 parts by weight to 145 parts by weight, 48 parts by weight to 143 parts by weight or 63 parts by weight to 132 parts by weight relative to 100 parts by weight of the epoxy compound. By controlling the specific composition and the content range thereof, the present application can form an organic layer on an organic electronic element by an inkjet method, makes it possible for the applied ink composition to have excellent spreadability in a short time, and can provide an organic layer having excellent curing sensitivity after curing. Furthermore, the ink composition can comprise a photoinitiator. The ink composition can realize excellent adhesive strength and curing sensitivity as well as processability as an ink composition together with the epoxy compound and the oxetane group-containing compound as described above.

In one example, the epoxy compound can have at least bifunctionality or more. That is, two or more epoxy functional groups can be present in the compound. The epoxy compound realizes excellent heat resistance at high temperature and high humidity by realizing an appropriate degree of crosslinking in a sealing material.

In an embodiment of the present application, the epoxy compound can comprise a compound having a cyclic structure in its molecular structure and/or a linear or branched aliphatic compound. That is, the ink composition of the present application can comprise at least one of a compound having a cyclic structure in its molecular structure and a linear or branched aliphatic compound as an epoxy compound, and can comprise them together. In one example, the compound having a cyclic structure in its molecular structure can have ring constituent atoms in the molecular structure in a range of 3 to 10, 4 to 8, or 5 to 7, and two or more cyclic structures can be present in the compound. When the compound having a cyclic structure and the linear or branched aliphatic compound are included together, the linear or branched aliphatic compound can be included in the ink composition in a range of 20 parts by weight to 200 parts by weight, 23 parts by weight to 190 parts by weight, 25 parts by weight to 180 parts by weight, 29 parts by weight to 175 parts by weight, or 32 parts by weight to 173 parts by weight, relative to 100 parts by weight of the compound having a cyclic structure. By controlling the content range, the present application makes it possible for the ink composition to have suitable physical properties in sealing the entire surface of an organic electronic element, to have excellent curing strength after curing and also to realize excellent moisture barrier properties together.

In one example, the linear or branched aliphatic compound can have an epoxy equivalent in a range of 120 g/eq to 375 g/eq or 120 g/eq to 250 g/eq. By controlling the epoxy equivalent of the aliphatic compound in the above range, the present application can prevent the viscosity of the composition from becoming too high to render the inkjet process impossible while improving the degree of curing completion after curing of the sealing material.

In one example, the epoxy compound can have an epoxy equivalent in a range of 50 to 350 g/eq, 73 to 332 g/eq, 94 to 318 g/eq, or 123 to 298 g/eq. Also, the compound having an oxetane group can have a weight average molecular weight in a range of 150 to 1,000 g/mol, 173 to 980 g/mol, 188 to 860 g/mol, 210 to 823 g/mol or 330 to 780 g/mol. By controlling the epoxy equivalent of the epoxy compound to be low or controlling the weight average molecular weight of the compound having an oxetane group to be low, the present application can realize an excellent printing property when applied to inkjet printing and simultaneously provide moisture barrier properties and excellent curing sensitivity. In this specification, the weight average molecular weight can mean a value converted to standard polystyrene measured by GPC (gel permeation chromatography). In this specification, the epoxy equivalent is also grams (g/eq) of the resin containing one gram equivalent of an epoxy group, which can be measured according to the method defined in JIS K 7236.

The compound having an oxetane group can have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an inkjet process, and prevent damage applied to the element due to suppressed outgas. In this specification, the boiling point can be measured at 1 atm, unless otherwise specified.

In one example, the compound having a cyclic structure in its molecular structure can be exemplified by a alicyclic epoxy compound. For example, the compound can be exemplified by 3,4-epoxycyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis(3,4-epoxycyclohexanecarboxylate) and derivatives, but is not limited thereto.

In one example, as long as the compound comprising an oxetane group has the oxetane functional group, the structure is not limited, and for example, OXT-221, CHOX, OX-SC, OXT101, OXT121, OXT221 or OXT212 from TOAGOSEI, or EHO, OXBP, OXTP or OXMA from ETERNACOLL can be exemplified. Also, the linear or branched aliphatic epoxy compound can include aliphatic glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, butyl glycidyl ether, 2-ethylhexyl glycidyl ether or neopentyl glycol diglycidyl ether, but is not limited thereto.

In an embodiment of the present application, the ink composition can further comprise a photoinitiator. The photoinitiator can be a cationic photopolymerization initiator. In addition, the photoinitiator can be a compound that absorbs a wavelength in a range of 200 nm to 400 nm.

As the cationic photopolymerization initiator, a known material in the art can be used and for example, it can include a compound having a cation moiety comprising aromatic sulfonium, aromatic iodonium, aromatic diazonium or aromatic ammonium and an anion moiety comprising $AsF_6^-$, $SbF_6^{31}$, $PF_6^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be used. A diaryliodonium salt, a triarylsulfonium salt or an aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and α-sulfonyloxy ketone or α-hydroxymethylbenzoin sulfonate and the like can be exemplified as the initiator of the latent sulfuric acid series, without being limited thereto.

In one example, the encapsulating composition of the present application can comprise a photoinitiator comprising an iodonium salt or a sulfonium salt as a photoinitiator in the above-mentioned specific composition, so as to be suitable for use in sealing an organic electronic element by an inkjet method. Although the encapsulating composition according to the above composition is directly sealed on the organic electronic element, it is possible to prevent chemical damage from being applied to the element due to a small amount of generated outgas. Furthermore, the photoinitiator also has excellent solubility, which can be suitably applied to an inkjet process.

In an embodiment of the present application, the photoinitiator can be included in an amount of 1 to 15 parts by weight, 2 to 13 parts by weight, or 3 to 11 parts by weight relative to 100 parts by weight of the epoxy compound.

In an embodiment of the present application, the ink composition can further comprise a surfactant. The ink composition comprises a surfactant, so that it can be provided as a liquid ink having enhanced spreadability. In one example, the surfactant can comprise a polar functional group. The polar functional group can include, for example, a carboxyl group, a hydroxyl group, a phosphate, an ammonium salt, a carboxylate group, a sulfate or a sulfonate. Furthermore, in an embodiment of the present application, the surfactant can be a non-silicone-based surfactant or a fluorine-based surfactant. The non-silicone-based surfactant or the fluorine-based surfactant can be applied together with the above-described epoxy compound and compound having an oxetane group to provide excellent coating properties on the organic electronic element. On the other hand, in the case of a surfactant containing a polar reactive group, since it has high affinity with the other components of the ink composition, it can participate in the curing reaction, thereby realizing an excellent effect in terms of adhesion. In an embodiment of the present application, a hydrophilic fluorine-based surfactant or non-silicone-based surfactant can be used to improve coating properties of a base material.

Specifically, the surfactant can be a polymer type or oligomer type fluorine-based surfactant. As the surfactant, a commercially available product can be used, which can be selected from the group consisting of Glide 100, Glide 110, Glide 130, Glide 460, Glide 440, Glide 450 or RAD 2500 from TEGO, Megaface F-251, F-281, F-552, F554, F-560, F-561, F-562, F-563, F-565, F-568, F-570 and F-571 from DIC (DaiNippon Ink Chemicals), or Surflon S-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant can be included in an amount of 0.1 to 10 parts by weight, 0.05 to 10 parts by weight, 0.1 to 10 parts by weight, 0.5 to 8 parts by weight or 1 to 4 parts by weight relative to 100 parts by weight of the curable compound. Within the above content range, the present application allows the ink composition to be applied to an inkjet method, thereby forming a thin film organic layer.

In an embodiment of the present application, the ink composition can further comprise a photosensitizer in order to complement the curing property at a long wavelength activation energy beam of 300 nm or more. The photosensitizer can be a compound that absorbs a wavelength in a range of 200 nm to 400 nm.

The photosensitizer can be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4-methoxybenzophenone and 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-propenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethylanthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone; a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate and 2-n-butoxyethyl-4-(dimethylamino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H-Cl]-[6,7,8-ij]-quinolizin-11-one; a chalcone compound such as 4-diethylaminochalcone and 4-azidobenzalacetophenone; 2-benzoylmethylene; and 3-methyl-b-naphthothiazoline.

The photosensitizer can be included in an amount of 28 to 40 parts by weight, 31 to 38 parts by weight or 32 to 36 parts by weight relative to 100 parts by weight of the photoinitiator to be described below. By controlling the content of the photosensitizer, the present application can prevent the photosensitizer from not dissolving to lower attachment force while realizing a synergistic effect of curing sensitivity at a desired wavelength.

The ink composition of the present application can further comprise a coupling agent. The present application can improve adhesiveness of a cured product of the ink composition to an adherend or moisture transmission resistance of the cured product. The coupling agent can include, for example, a titanium-based coupling agent, an aluminum-based coupling agent, or a silane coupling agent.

In an embodiment of the present application, the silane coupling agent can include, specifically, an epoxy-based silane coupling agent such as 3-glycidyloxypropyltrimethoxysilane, 3-glycidyloxypropyltriethoxysilane, 3-glycidyloxypropyl (dimethoxy)methylsilane and 2-(3,4-epoxy-cyclohexyl)ethyltrimethoxysilane; a mercapto-based silane coupling agent such as 3-mercaptopropyltrimethoxysilane, 3-mercaptopropyltriethoxysilane, 3-mercaptopropylmethyl-dimethoxysilane and 11-mercaptoundecyltrimethoxysilane; an amino-based silane coupling agent such as 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane and N-(2-aminoethyl)-3-aminopropyldimethoxymethylsilane; a ureide-based silane coupling agent such as 3-ureidepropyltriethoxysilane; a vinyl-based silane coupling agent such as vinyltrimethoxysilane, vinyltriethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilylpropyl)disulfide and bis(triethoxysilylpropyl)tetrasulfide; phenyltrimethoxysilane, methacryloxypropyltrimethoxysilane, imidazolesilane, triazinesilane, and the like.

In the present application, the coupling agent can be included in an amount of 0.1 to 10 parts by weight or 0.5 to 5 parts by weight, relative to 100 parts by weight of the epoxy compound. Within the above range, the present application can realize an effect of improving the adhesiveness by the addition of the coupling agent.

The ink composition of the present application can comprise, if necessary, a moisture adsorbent. The term "moisture adsorbent" can be used to generically mean a component capable of adsorbing or removing moisture or humidity introduced from the outside through a physical or chemical reaction or the like. That is, it means a moisture-reactive adsorbent or a physical adsorbent, and a mixture thereof is also usable.

A specific kind of the usable moisture adsorbent in the present application is not particularly limited, which can include, for example, one or a mixture of two or more of a metal oxide, a metal salt or phosphorus pentoxide ($P_2O_5$), and the like, in the case of a moisture-reactive adsorbent, and can include zeolite, zirconia or montmorillonite, and the like, in the case of the physical adsorbent.

The ink composition of the present application can comprise the moisture adsorbent in an amount of 5 parts by weight to 100 parts by weight, 5 to 80 parts by weight, 5 parts by weight to 70 parts by weight or 10 to 30 parts by weight, relative to 100 parts by weight of the epoxy compound. As the ink composition of the present application preferably controls the content of the moisture adsorbent to 5 parts by weight or more, the present application can make the ink composition or the cured product thereof exhibit excellent moisture and humidity barrier properties. In addition, by controlling the content of the moisture adsorbent to 100 parts by weight or less, the present application can provide a thin film sealing structure.

In one example, the ink composition can further comprise an inorganic filler, if necessary. The specific type of the usable filler in the present application is not particularly limited, and for example, one or a mixture of two or more of clay, talc, alumina, calcium carbonate, silica, and the like can be used.

The ink composition of the present application can comprise 0 to 50 parts by weight, 1 to 40 parts by weight, 1 to 20 parts by weight, or 1 to 10 parts by weight of inorganic filler, relative to 100 parts by weight of the epoxy compound. The present application can provide a sealing structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin film.

In addition to the above-mentioned constitutions, the ink composition according to the present application can comprise various additives in the range without affecting the above-described effects of invention. For example, the ink composition can comprise a defoamer, a tackifier, an ultraviolet stabilizer or an antioxidant and the like in an appropriate range of content depending on the desired physical properties.

In one example, the ink composition can be in a liquid phase at room temperature, for example, at 15° C. to 35° C. or about 25° C. In an embodiment of the present application, the ink composition can be in a solventless type liquid phase. The ink composition can be applied to seal an organic electronic element, and specifically, the ink composition can be an ink composition that can be applied to seal the entire surface of an organic electronic element. As the ink composition has a liquid form at room temperature, the present application can seal an organic electronic element by applying the composition on the side of the element with the inkjet method.

Also, in an embodiment of the present application, the ink composition can have a viscosity, as measured by DV-3 from Brookfield, Inc. at a temperature of 25° C., 90% torque and a shear rate of 100 rpm, in a range of 50 cP or less, 1 to 46 cP, 3 to 44 cP, 4 to 38 cP, 5 to 33 cP or 14 to 24 cP. By controlling the viscosity of the composition in the above range, the present application can provide a sealing material of a thin film by improving the coating property at the time of application to the organic electronic element.

Also, in an embodiment of the present application, the ink composition can have light transmittance of 90% or more, 92% or more, or 95% or more in the visible light region after curing. Within the above range, the present application provides an organic electronic device having high-resolution, low power consumption and long-life by applying the ink composition to a top emission type organic electronic device. In one example, the ink composition may not comprise the above-described moisture adsorbent or inorganic filler in consideration of the above-described optical characteristics.

In one example, the ink composition of the present application can have a contact angle to glass of 30° or less, 25° or less, 20° or less, or 12° or less. The lower limit is not particularly limited, but can be 1° or 3° or more. By adjusting the contact angle to 30° or less, the present application can ensure spreadability in a short time in the inkjet coating, thereby forming an organic layer of a thin film. In the present application, the contact angle can be measured by applying a drop of the encapsulating composition onto glass using a sessile drop measurement method, which can be an average value measured after applying 5 times.

The present application also relates to an organic electronic device. An exemplary organic electronic device can comprise, as shown in FIG. 1, a substrate (31); an organic electronic element (32) formed on the substrate (31); and an organic layer (33) that seals the entire surface of the organic electronic element (32).

The organic layer can have an out-gas amount of less than 150 ppm, less than 100 ppm or less than 50 ppm as measured using Purge & Trap-gas chromatography/mass spectrometry after holding it at 110° C. for 30 minutes. More specifically, after the cured organic layer is maintained at 110° C. for 30 minutes, the out-gas can be measured with Purge & Trap-gas chromatography/mass spectrometry by using a Purge & Trap sampler (JAI JTD-505III)-GC/MS (Agilent 7890b/5977a) instrument.

The organic electronic device can comprise an organic layer applied by the above-described preparation method. By comprising the organic layer, the present application provides an organic electronic device which has top attachment force by excellent flatness and can prevent damage to the element by the minimized out-gas amount.

In an embodiment of the present application, the organic electronic element can comprise a first electrode layer, an organic layer formed on the first electrode layer and containing at least a light emitting layer, and a second electrode layer formed on the organic layer. The first electrode layer can be a transparent electrode layer or a reflective electrode layer, and the second electrode layer can also be a transparent electrode layer or a reflective electrode layer. More specifically, the organic electronic element can comprise a reflective electrode layer formed on a substrate, an organic layer formed on the reflective electrode layer and containing at least a light emitting layer, and a transparent electrode layer formed on the organic layer.

In the present application, the organic electronic element can be an organic light emitting diode.

In one example, the organic electronic device according to the present application can be a top emission type, but is not limited thereto, and can be applied to a bottom emission type.

The organic electronic device (3) can further comprise an inorganic protective layer (35) for protecting the electrodes and the light emitting layer of the organic electronic element (32). The inorganic protective layer can be an inorganic layer. The inorganic protective layer (35) can be present between the organic electronic element (32) and the above-described organic layer (33). The inorganic layer can be a protective layer formed by chemical vapor deposition (CVD). As the material, a known inorganic material can be used.

In an embodiment of the present application, the organic electronic device (3) can further comprise an inorganic layer (34) formed on the organic layer (33). In one example, the inorganic layer can be one or more metal oxides, nitrides or oxynitrides selected from the group consisting of Al, Zr, Ti, Hf, Ta, In, Sn, Zn and Si. The inorganic layer can have a thickness of 0.01 μm to 50 μm, 0.1 μm to 20 μm, or 1 μm to 10 μm. In one example, the inorganic layer of the present application can be an inorganic material without any dopant, or can be an inorganic material containing a dopant. The dopant which can be doped can be one or more elements selected from the group consisting of Ga, Si, Ge, Al, Sn, Ge, B, In, Tl, Sc, V, Cr, Mn, Fe, Co and Ni, or an oxide of the element, but is not limited thereto.

In one example, the thickness of the organic layer can be in a range of 2 μm to 20 μm, 2.5 μm to 15 μm, and 2.8 μm to 11 μm. The present application can prevent damage to the element due to light by providing a thin organic layer to provide a thin film organic electronic device and simultaneously sufficiently curing it by the above-described light irradiation quantity.

The organic electronic device of the present application can comprise a sealing structure containing the organic layer and the inorganic layer, as described above, where the sealing structure can comprise at least one or more organic layers and at least one or more inorganic layers, and the organic layer and the inorganic layer can be repeatedly laminated. For example, the organic electronic device can have a structure of substrate/organic electronic element/inorganic protective layer/(organic layer/inorganic layer)n, where n can be a number in a range of 1 to 100.

In one example, the organic electronic device of the present application can further comprise a cover substrate present on the organic layer. The material of the substrate and/or the cover substrate is not particularly limited, and a known material in the art can be used. For example, the substrate or the cover substrate can be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like can be used.

Also, as shown in FIG. 2, the organic electronic device (3) can further comprise a sealing film (37) existing between the cover substrate (38) and the substrate (31) on which the organic electronic element (32) is formed. The sealing film (37) can be applied as a use for attaching the substrate (31) on which the organic electronic element (32) is formed and the cover substrate (38), which can be, for example, a pressure-sensitive adhesive film or an adhesive film in a solid phase at room temperature, but is not limited thereto. The sealing film (37) can seal the entire surface of the sealing structure (36) of the above-described organic layer and inorganic layer, laminated on the organic electronic element (32).

Advantageous Effects

The present invention relates to a method for preparing an organic electronic device, which provides a method for preparing an organic electronic device that can effectively block moisture or oxygen introduced from the outside into an organic electronic device, is excellent in flatness of a sealing film and can minimize an out-gas amount occurring in a sealing process, and an organic electronic device.

BRIEF DESCRIPTION OF DRAWINGS

FIGS. 1 and 2 are cross-sectional views showing an organic electronic device according to one example of the present invention.

EXPLANATION OF REFERENCE NUMERALS

3: organic electronic device
31: substrate
32: organic electronic element
33: organic layer
34: inorganic layer
35: inorganic protective layer
36: sealing structure
37: sealing film
38: cover substrate Detailed Description Hereinafter, the present invention will be described in more detail through Examples according to the present invention and Comparative Examples not complying with the present invention, but the scope of the present invention is not limited by the following examples.

Preparation of Ink Composition

An alicyclic epoxy compound (Celloxide 2021P, Daicel Corp.) and an aliphatic epoxy compound (DE200, HAJIN CHEM TECH) as epoxy compounds, an oxetane group-containing compound (OXT-221 from TOAGOSEI), a photoinitiator comprising an iodonium salt (TTA-UV694 from Tetrachem, hereinafter, UV694) and a fluorine-based surfactant (F552 from DIC) were introduced into a mixing vessel in a weight ratio of 23.8:28.7:37.5:5.0:1.0 (Celloxide2021P: DE200: OXT-221: UV694: F552), respectively, at room temperature.

In the mixing vessel, a uniform ink composition was prepared using a planetary mixer (Kurabo, KK-250s).

EXAMPLE 1

The prepared ink composition was subjected to ink jetting on a substrate, on which an organic electronic element was formed, using Unijet UJ-200 (Inkjet head-Dimatix 10Pl 256) to form an organic layer having a pattern size of 1×10 cm and a thickness of 10 μm. The applied ink composition was subjected to heat treatment at 100° C. for 3 minutes using a hot plate. The ink composition was irradiated with UV of 1 J/cm$^2$ having a wavelength of 395 nm and an intensity of 1000 mW/cm$^2$ under a 5% relative humidity condition and cured to prepare an organic electronic device.

EXAMPLE 2

An organic electronic device was prepared in the same manner as in Example 1, except that the applied ink composition was subjected to heat treatment at 25° C. for 3 minutes, and further heat treatment at 60° C. for 30 minutes after curing.

EXAMPLE 3

An organic electronic device was prepared in the same manner as in Example 1, except that the applied ink composition was subjected to heat treatment at 30° C. for 10 minutes, and further heat treatment at 150° C. for 3 minutes after curing.

EXAMPLE 4

An organic electronic device was prepared in the same manner as in Example 1, except that the applied ink composition was subjected to heat treatment at 25° C. for 3 minutes before curing.

EXAMPLE 5

An organic electronic device was prepared in the same manner as in Example 1, except that the applied ink composition was subjected to heat treatment at 60° C. for 10 minutes, and further heat treatment at 200° C. for 10 minutes after curing.

EXAMPLE 6

An organic electronic device was prepared in the same manner as in Example 1, except that the applied ink composition was subjected to heat treatment at 30° C. for 10 minutes, and further heat treatment at 120° C. for 90 minutes after curing.

COMPARATIVE EXAMPLE 1

An organic electronic device was prepared in the same manner as in Example 1, except that no heat treatment was performed.

COMPARATIVE EXAMPLE 2

An organic electronic device was prepared in the same manner as in Example 1, except that no heat treatment was performed before curing, and the heat treatment proceeded at 150° C. for 3 minutes after curing.

COMPARATIVE EXAMPLE 3

An organic electronic device was prepared in the same manner as in Example 3, except that in the curing step, it was irradiated with UV of 1 J/cm$^2$ having a wavelength range of 255 nm and an intensity of 1000 mW/cm$^2$ under a 5% relative humidity condition and cured to prepare an organic electronic device.

Physical properties in Examples and Comparative Examples were evaluated in the following manner.

1. Pattern Step Measurement and Flatness Measurement

The thickness A of the central part of the pattern is measured for each organic layer pattern formed in Examples and Comparative Examples, and at the same time, the thickest region of the edge side of the pattern was measured as the thickness B. At this time, it was measured what extent the pattern step had occurred relative to the pattern thicknesses by calculating them as (B-A)/A×100. It was classified as excellent in the case where the step was 10% or less, good in the case where it was 20% or less, and poor in the case where it was more than 20%.

2. Out-Gas MEASUREMENT

The cured ink compositions of Examples and Comparative Examples were maintained at 110° C. for 30 minutes and their out-gas amounts were measured by using a Purge & Trap sampler (JAI JTD-505III)-GC/MS (Agilent 7890b/5977a) instrument with Purge &Trap-gas chromatography/mass spectrometry. It was classified as ⊚ in the case where it was less than 50 ppm, 0 in the case where it was less than 100 ppm, Δ in the case where it was less than 150 ppm, and X in the case where it was 150 ppm or more.

3. Dark Spot

The organic electronic devices prepared in Examples and Comparative Examples were observed for dark spots under constant temperature and humidity conditions at 85° C. and 85% RH. It was checked if there are no dark spots generated by observing them for 300 hours. It was classified as ⊚ in the case where no dark spot occurred, O in the case where one or less of dark spot occurred, Δ in the case where 5 or less of dark spots occurred, and X in the case where more than 5 of dark spots occurred.

TABLE 1

| | Pattern Step (%) | Flatness | Out-gas | Dark Spot |
|---|---|---|---|---|
| Example 1 | 7.5 | Excellent | ○ | ○ |
| Example 2 | 16.7 | Good | ⊚ | ○ |
| Example 3 | 8.1 | Excellent | ⊚ | ⊚ |
| Example 4 | 19.2 | Good | Δ | Δ |
| Example 5 | 7.8 | Excellent | ○ | Δ |
| Example 6 | 8.1 | Excellent | Δ | Δ |
| Comparative Example 1 | 34.9 | Poor | X | X |

TABLE 1-continued

| | Pattern Step (%) | Flatness | Out-gas | Dark Spot |
|---|---|---|---|---|
| Comparative Example 2 | 29.4 | Poor | ○ | Δ |
| Comparative Example 3 | Not measurable (Poor curing) | Not measurable (Poor curing) | Not measurable (Poor curing) | X |

The invention claimed is:

1. A method for preparing an organic electronic device, comprising steps of:
    applying an ink composition on a substrate, on which an organic electronic element is formed;
    applying heat thereto before curing the applied ink composition;
    curing the applied ink composition by irradiating with light having a wavelength in a range of 300 nm to 450 nm, and
    applying heat after curing at a temperature in a range of 20° C. to 230° C. for 1 minute to 40 minutes.

2. The method according to claim 1, wherein the step of applying heat before curing proceeds at a temperature in a range of 20° C. to 110° C., and the step of applying heat after curing proceeds at a temperature in a range of 50° C. to 230° C.

3. The method according to claim 1, wherein the ratio (T2/T1) of the temperature (T2) for applying heat after curing to the temperature (T1) for applying heat before curing is in a range of 1.15 to 8.

4. The method according to claim 1, further comprising a step of planarizing the applied ink composition before curing.

5. The method according to claim 4, wherein the step of the planarizing proceeds for one time from 1 minute to 5 minutes.

6. The method according to claim 1, wherein the step of applying an ink composition comprises ejecting the ink composition using an inkjet apparatus.

7. The method according to claim 1, wherein the ink composition is a solventless type.

8. The method according to claim 1, wherein the ink composition is a photocurable composition.

9. The method according to claim 1, wherein after the applied ink composition is maintained at 110° C. for 30 minutes after curing, the out-gas amount measured using Purge & Trap-gas chromatography/mass spectrometry is less than 150 ppm.

* * * * *